US009257177B2

(12) United States Patent
Foong et al.

(10) Patent No.: US 9,257,177 B2
(45) Date of Patent: Feb. 9, 2016

(54) WRITE CONTROL CIRCUITS AND WRITE CONTROL METHODS

(71) Applicant: Agency for Science, Technology and Research, Singapore (SG)

(72) Inventors: Huey Chian Foong, Singapore (SG); Kejie Huang, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 14/184,645

(22) Filed: Feb. 19, 2014

(65) Prior Publication Data

US 2014/0233331 A1 Aug. 21, 2014

Related U.S. Application Data

(60) Provisional application No. 61/766,151, filed on Feb. 19, 2013.

(51) Int. Cl.
G11C 7/00 (2006.01)
G11C 13/00 (2006.01)

(52) U.S. Cl.
CPC ........ G11C 13/0069 (2013.01); G11C 13/0004 (2013.01); G11C 13/0007 (2013.01); G11C 13/0064 (2013.01); G11C 2013/0066 (2013.01); G11C 2013/0078 (2013.01); G11C 2213/79 (2013.01)

(58) Field of Classification Search
CPC .......... G11C 13/0069; G11C 13/0004; G11C 2013/0073; G11C 2013/0078; G11C 11/5628; G11C 11/1675
USPC ........................ 365/189.16, 148, 158, 185.21
See application file for complete search history.

(56) References Cited

U.S. PATENT DOCUMENTS

| 6,225,833 | B1 * | 5/2001 | Brown ............................. 327/52 |
| 7,593,249 | B2 * | 9/2009 | Fasoli et al. .................... 365/105 |
| 9,032,140 | B2 * | 5/2015 | Allers et al. ................... 711/103 |
| 2005/0117388 | A1 | 6/2005 | Cho et al. | |
| 2014/0003126 | A1 | 1/2014 | Huang | |

* cited by examiner

Primary Examiner — David Lam
(74) Attorney, Agent, or Firm — Blakely, Sokoloff, Taylor & Zafman LLP

(57) ABSTRACT

According to various embodiments, a write control circuit configured to control writing to a memory cell by applying a writing current to the memory cell may be provided. The write control circuit may include: a current application circuit configured to apply the writing current to the memory cell; a determination circuit configured to determine whether writing to the memory cell is finished; and a stop writing circuit configured to cut off the writing current from the memory cell if it is determined that writing to the memory cell is finished.

18 Claims, 11 Drawing Sheets

SA sharing structure

WRITE CONTROL CIRCUITS AND WRITE CONTROL METHODS

CROSS-REFERENCE TO RELATED APPLICATIONS

The present application claims the benefit of the U.S. provisional patent application No. 61/766,151 filed on 19 Feb. 2013, the entire contents of which are incorporated herein by reference for all purposes.

TECHNICAL FIELD

Embodiments relate generally to write control circuits and write control methods.

BACKGROUND

Resistive non-volatile memory (NVM) may have a write pulse width distribution for different cells. Clock controlled 'set' and 'reset' may have the same pulse width for all NVM cells. The pulse width may be desired to meet the worst case (longest pulse width) with margin. The cells with short "set/reset" pulse width may be over written, which may increase the resistance distribution and reduce endurance of the cells. Thus, there may be a need for an advanced writing scheme.

SUMMARY

According to various embodiments, a write control circuit configured to control writing to a memory cell by applying a writing current to the memory cell may be provided. The write control circuit may include: a current application circuit configured to apply the writing current to the memory cell; a determination circuit configured to determine whether writing to the memory cell is finished; and a stop writing circuit configured to cut off the writing current from the memory cell if it is determined that writing to the memory cell is finished.

According to various embodiments, a write control method for controlling writing to a memory cell by applying a writing current to the memory cell may be provided. The write control method may include: applying the writing current to the memory cell; determining whether writing to the memory cell is finished; and cutting off the writing current from the memory cell if it is determined that writing to the memory cell is finished.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DESCRIPTION

Embodiments described below in context of the devices are analogously valid for the respective methods, and vice versa. Furthermore, it will be understood that the embodiments described below may be combined, for example, a pan of one embodiment may be combined with a part of another embodiment.

In this context, the write control circuit as described in this description may include a memory which is for example used in the processing carried out in the write control circuit. A memory used in the embodiments may be a volatile memory, for example a DRAM (Dynamic Random Access Memory) or a non-volatile memory, for example a PROM (Programmable Read Only Memory), an EPROM (Erasable PROM), EEPROM (Electrically Erasable PROM), or a flash memory, a floating gate memory, a charge trapping memory, an MRAM (Magnetoresistive Random Access Memory) or a PCRAM (Phase Change Random Access Memory).

In an embodiment, a "circuit" may be understood as any kind of a logic implementing entity, which may be special purpose circuitry or a processor executing software stored in a memory, firmware, or any combination thereof. Thus, in an embodiment, a "circuit" may be a hard-wired logic circuit or a programmable logic circuit such as a programmable processor, e.g. a microprocessor (e.g. a Complex Instruction Set Computer (CISC) processor or a Reduced Instruction Set Computer (RISC) processor). A "circuit" may also be a processor executing software, e.g. any kind of computer program, e.g. a computer program using a virtual machine code such as e.g. Java. Any other kind of implementation of the respective functions which will be described in more detail below may also be understood as a "circuit" in accordance with an alternative embodiment.

Resistive non-volatile memory (NVM) may have a write pulse width distribution for different cells. Clock controlled 'set' and 'reset' may have the same pulse width for all NVM cells. The pulse width may be desired to meet the worst case (longest pulse width) with margin. The cells with short "set/reset" pulse width may be over written, which may increase the resistance distribution and reduce endurance of the cells. Thus, there may be a need for an advanced writing scheme.

Writing circuits for resistive nonvolatile memory (NVM) may require for example the following:

Resistive NVM (RRAM (Resistive random-access memory) or PCRAM (Phase change random-access memory)) may have a write pulse width distribution for different cells, which may be a problem;

Clock controlled 'set' and 'reset' may have the same pulse width for all NVM cells. The pulse width needs to meet the worst case (longest pulse width) with margin, for example like will be described with reference to FIG. 1 below; and The cells with short "set/reset" pulse width may be overwritten, which may increase the resistance distribution and reduces endurance of the cells.

Figure 1:
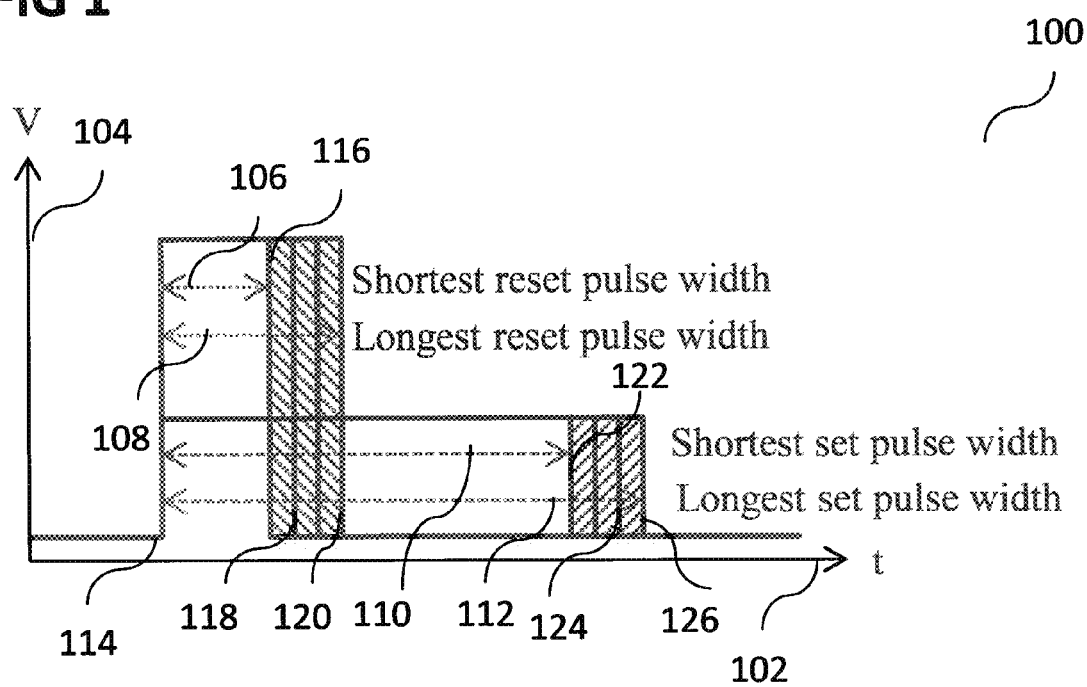
FIG. 1 shows an illustration of set and reset pulses.

FIG. 1 shows an illustration 100 of set and reset pulses. A horizontal axis 102 indicates time t, and a vertical axis 104 indicates voltage. Set pulses and reset pulses are shown, for example starting on a low voltage 114.

For example for the reset pulses, voltage may be increased for a pre-determined period of time, for example between a minimum length resulting in a shortest reset pulse width 106, and a maximum length resulting in a longest reset pulse width 108. Thus, various time instances for returning to the low voltage 114 may be possible, for example like indicated by 116, 118, and 120.

For the set pulses, likewise voltage may be increased from the low voltage 114 for a pre-determined period of time, for example between a minimum length resulting in a shortest set pulse width 110, and a maximum length resulting in a longest set pulse width 112. Thus, various time instances for returning to the low voltage 114 may be possible, for example like indicated by 122, 124, and 126.

For example, the high voltage for the reset pulse may be higher than the high voltage for the set pulse. For example, the length of the reset pulse may be shorter than the length of the set pulse.

According to various embodiments, a self-controlled auto barn-off writing circuit for resistive non-volatile memory may be provided.

Figure 2A:
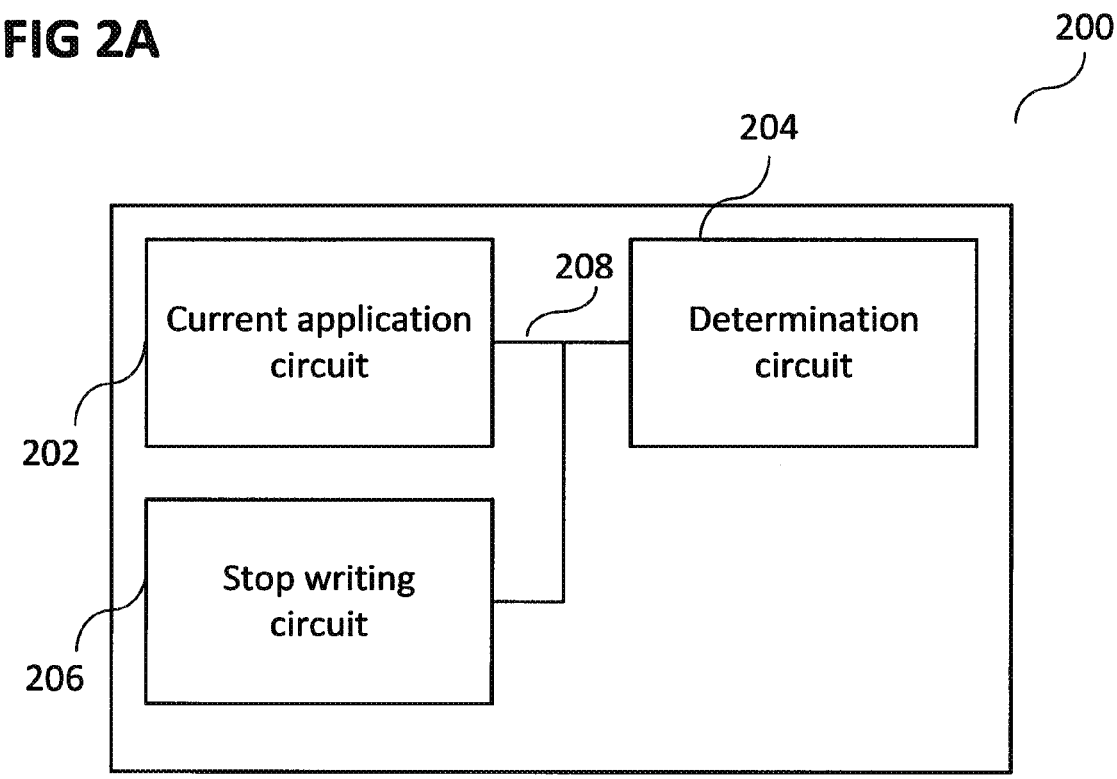
FIG. 2A shows a write control circuit according to various embodiments.

FIG. 2A shows a write control circuit 200 according to various embodiments. The write control circuit 200 may be configured to control writing to a memory cell by applying a writing current to the memory cell. The write control circuit 200 may include a current application circuit 202 configured to apply the writing current to the memory cell. The write control circuit 200 may include a determination circuit 204 configured to determine whether writing to the memory cell is finished. The write control circuit 200 may include a stop writing circuit 206 configured to cut off the writing current from the memory cell if it is determined that writing to the memory cell is finished. The current application circuit 202, the determination circuit 204, and the stop writing circuit 206 may be coupled with each other, like indicated by a lines 208, for example electrically coupled, for example using a line or a cable, and/or mechanically coupled.

In other words, the write control circuit 200 may apply the writing current only until it is determined that the writing is finished, for example successfully finished, or only until a pre-determined period after it is determined that the writing is finished.

According to various embodiments, the determination circuit 204 may be configured to determine whether writing to the memory cell is finished based on a bitline voltage of the memory cell.

According to various embodiments, the determination circuit 204 may be configured to determine whether writing to the memory cell is finished based on comparing the bitline voltage of the memory cell with a reference voltage.

Figure 2B:
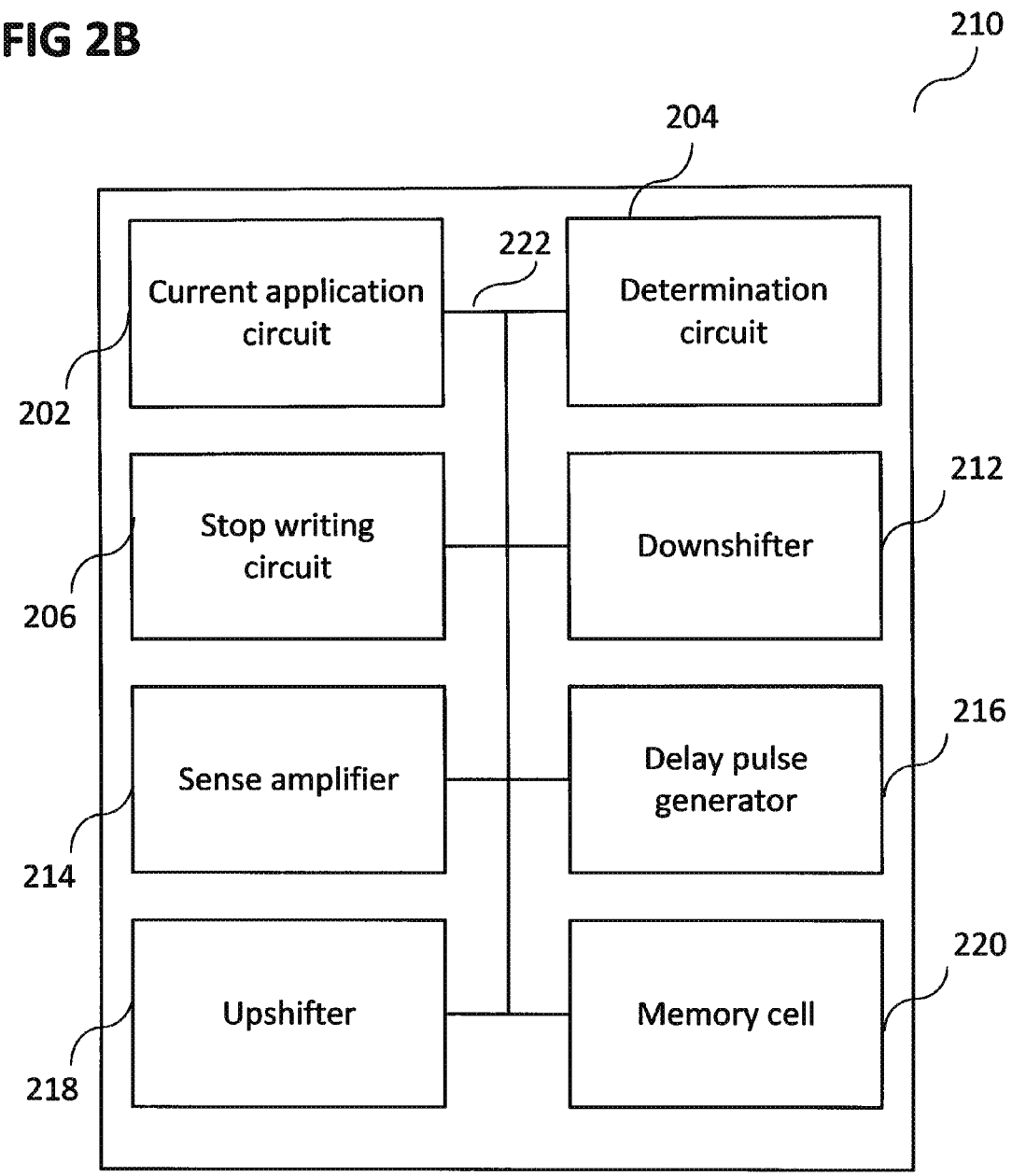
FIG. 2B shows a further write control circuit according to various embodiments.

FIG. 2B shows a write control circuit 210 according to various embodiments. The write control circuit 210 may, similar to the write control circuit 200 of FIG. 2A, include a current application circuit 202. The write control circuit 210 may, similar to the write control circuit 200 of FIG. 2A, further include a determination circuit 204. The write control circuit 210 may, similar to the write control circuit 200 of FIG. 2A, further include a stop writing circuit 206. The write control circuit 210 may further include a downshifter 212, like will be described in more detail below. The write control circuit 210 may further include a sense amplifier 214, like will be described in more detail below. The write control circuit 210 may further include a delay pulse generator 216, like will be described in more detail below. The write control circuit 210 may further include an upshifter 218, like will be described in more detail below. The write control circuit 210 may further include the memory cell 220. The current application circuit 202, the determination circuit 204, the stop writing circuit 206, the downshifter 212, the sense amplifier 214, the delay pulse generator 216, the upshifter 218, and the memory cell 220 may be coupled with each other, like indicated by a lines 222 for example electrically coupled, for example using a line or a cable, and/or mechanically coupled.

According to various embodiments, the downshifter 212 may be configured to downshift the bitline voltage.

According to various embodiments, the sense amplifier 214 may be configured to compare the downshifted bitline voltage with a reference voltage. According to various embodiments, the determination circuit 204 may be configured to determine whether writing to the memory cell 220 is finished based on the comparison of the sense amplifier 214.

According to various embodiments, the delay pulse generator 216 may be configured to generate a delayed pulse. According to various embodiments, the stop writing circuit 206 may be configured to cut off the writing current from the memory cell 220 based on the delayed pulse.

According to various embodiments, the upshifter 218 may be configured to boost up the delayed pulse. According to various embodiments, the stop writing circuit 206 may be configured to cut off the writing current from the memory cell 220 based on the boosted delayed pulse.

According to various embodiments, the current application circuit 202 may include or may be a current mirror (not shown in FIG. 2B).

According to various embodiments, the stop writing circuit 206 may be configured to cut off the writing current from the memory cell 220 by disabling the current mirror.

According to various embodiments, the current application circuit 202 may be configured to apply the writing current to the memory cell 220 for bipolar writing. According to various embodiments, the determination circuit 204 may be configured to determine whether writing to the memory cell 220 is finished based on a source line voltage of the memory cell 220.

According to various embodiments, the memory cell 220 may include or may be a resistive random access memory and/or a phase change random access memory.

Figure 2C:
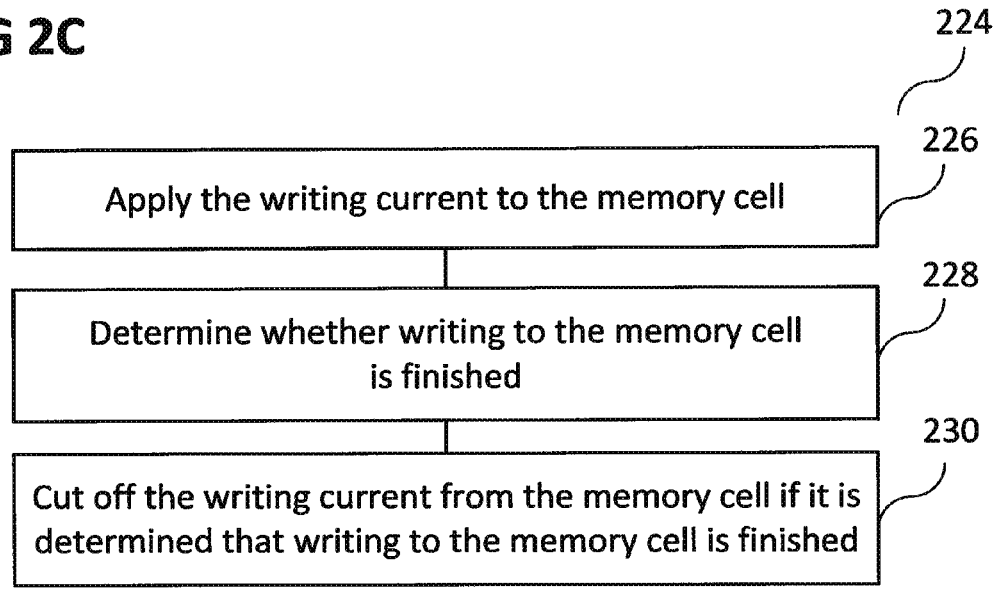
FIG. 2C shows a flow diagram illustrating a write control method according to various embodiments.

FIG. 2C shows a flow diagram 224 illustrating a write control method for controlling writing to a memory cell by applying a writing current to the memory cell according to various embodiments. In 226, the writing current may be applied to the memory cell. In 228, it may be determined whether writing to the memory cell is finished. In 230, the writing current may be cut off from the memory cell if it is determined that writing to the memory cell is finished.

According to various embodiments, the method may further include determining whether writing to the memory cell is finished based on a bitline voltage of the memory cell.

According to various embodiments, the method may further include determining whether writing to the memory cell is finished based on comparing the bitline voltage of the memory cell with a reference voltage.

According to various embodiments, the method may further include downshifting the bitline voltage.

According to various embodiments, the method may further include: comparing the downshifted bitline voltage with a reference voltage; and determining whether writing to the memory cell is finished based on the comparing.

According to various embodiments, the method may further include cutting off the writing current from the memory cell based on the delayed pulse.

According to various embodiments, the method may further include: boosting up the delayed pulse; and cutting off the writing current from the memory cell based on the boosted delayed pulse.

According to various embodiments, the method may further include: applying the writing current to the memory cell for bipolar writing; and determining whether writing to the memory cell is finished based on a source line voltage of the memory cell.

According to various embodiments, a read/write circuit of a resistive non-volatile memory with auto-shutdown function may be provided. This auto shut-down feature may provide the generation of precise pulses to set and reset the NVM to low and high resistance states respectively. The resistance value of NVM after set and reset typically shows distribution, which is caused by process variations. Methods of writing the cells with constant pulse-width may result in over-time writing or under-time writing. By self-controlling the pulses with auto shut-down, the access time of the memory may be optimized.

According to various embodiments, an auto-shutdown of the driving transistor may be provided to prevent over-current, over-temperature protection and over-time writing (for the cells requiring short pulse writing pulse width). According to various embodiments, the resistance distribution may be reduced since R=V/I, V (voltage) and I (current) are fixed, R (resistance) distribution may be minimized. According to various embodiments, a precise control of the set and reset states of resistive NVM and improved writing accuracy may be provided. According to various embodiments, IC (integrated circuit) area may be saved by reusing the sense amplifier in the feedback loop during write operation.

According to various embodiments, an auto shut-down architecture for a write driver may turn off the set and reset pulses automatically after successful writing the memory cell. The circuit may include: a sense amplifier for comparing the voltage between the down-shifted input and the reference voltages; a source follower for downshifting the voltage for sense amplifier working in the lower supply voltage regime; a delay pulse generator to generate the feedback pulse to shut off the driving circuit; and a level shifter to boost up the delay pulse generator output.

Advantages of the writing circuit according to various embodiments include:
 Auto-shutdown of the 'set' and 'reset' pulse once the 'set' and 'reset' operation finish;
 Increased endurance of resistive NVM cells;
 Increased reliability of set and reset the NVM cell to low and high resistance state respectively;
 Lower power consumption:
 Little IC area is increased due to reuse-technique, increase resistive NVM density;
 Reduced resistance distribution; and
 Pre-detect resistive NVM states, no requirement of read before write.

Resistive non-volatile memory is nonvolatile memory that stores information through a reversible structural phase change in a chalcogenide material, e.g. phase-change memory (far example PCRAM), or filament formation in dielectric, e.g. ReRAM (resistive random access memory). The chalcogenide material undergoes a change in material properties, for example both electrical and optical, when changed from the amorphous (disordered) to the polycrystalline (regularly ordered) state. On the other hand, for the resistive random access memory, information is stored via the filament formed in dielectric when high voltage is applied.

Figure 3:
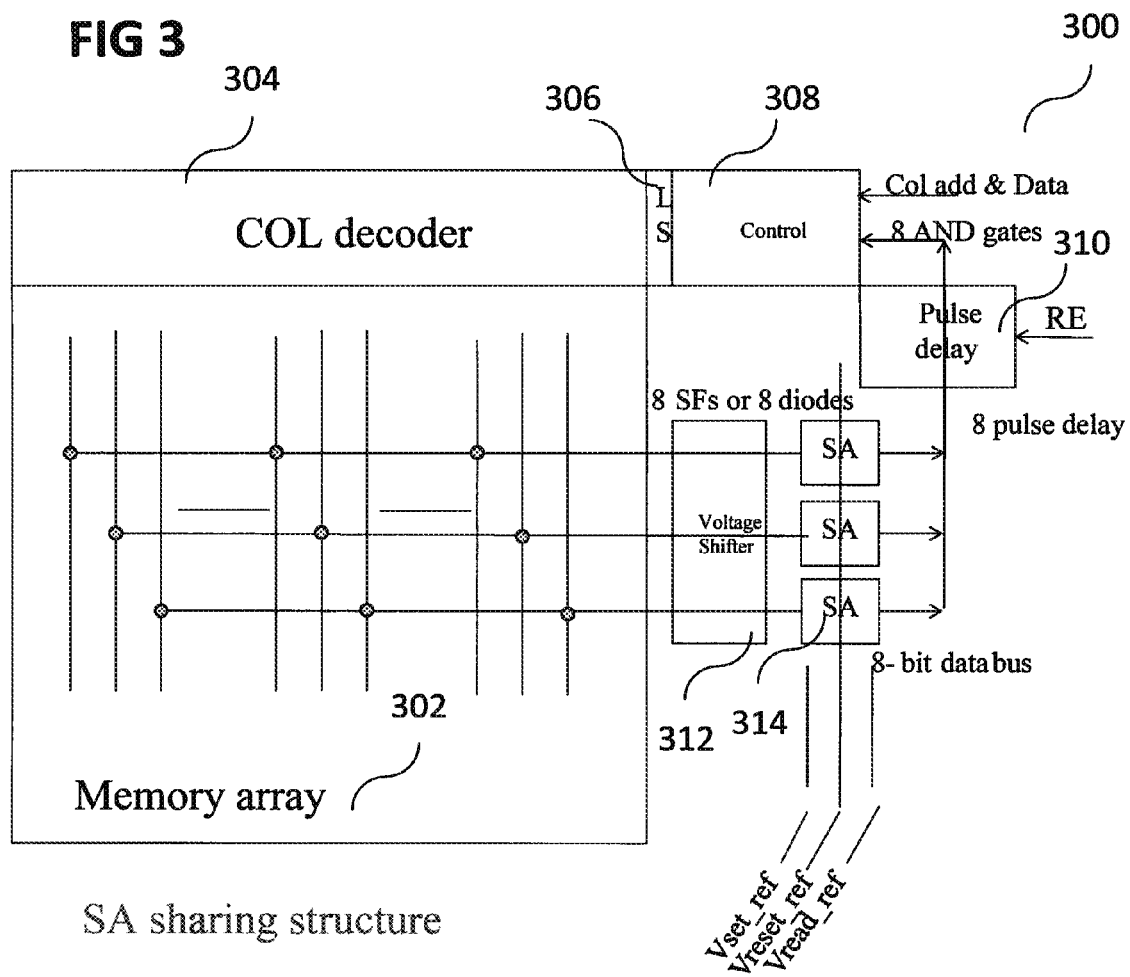
FIG. 3 is a diagram illustrating the memory array architecture of the present invention according to various embodiments.

FIG. 3 shows a diagram depicting the architecture 300 of a memory array 302 according to various embodiments (for example including an sense amplifier sharing structure). In this architecture, for example an 8-bit data bus may be provided, which means that 8 bits data are written to or read from 3 different memory cells simultaneously. The feedback signals from the sense amplifier 314 output may be fed back to the column (COL) control circuits 304 to determine the time to turn off the writing circuits. The architecture may include 8 voltage shifters 312 needed to down-shift the voltage of the signal, 8 sense amplifiers 314, 8 pulse delay generators 310 and control circuit 308 to turn-off the column driving circuit 304. A level shifter (LS) circuit 306 may be provided, like will be described in more detail below. It will be understood that although an 8-bit data bus is described (while only three bits are illustrated), any number of bits may be provided by the data bus. It will be understood that the pulse delay circuit 310 and the voltage shifter 312 provide circuits to realize the auto turn-off.

Figure 4:
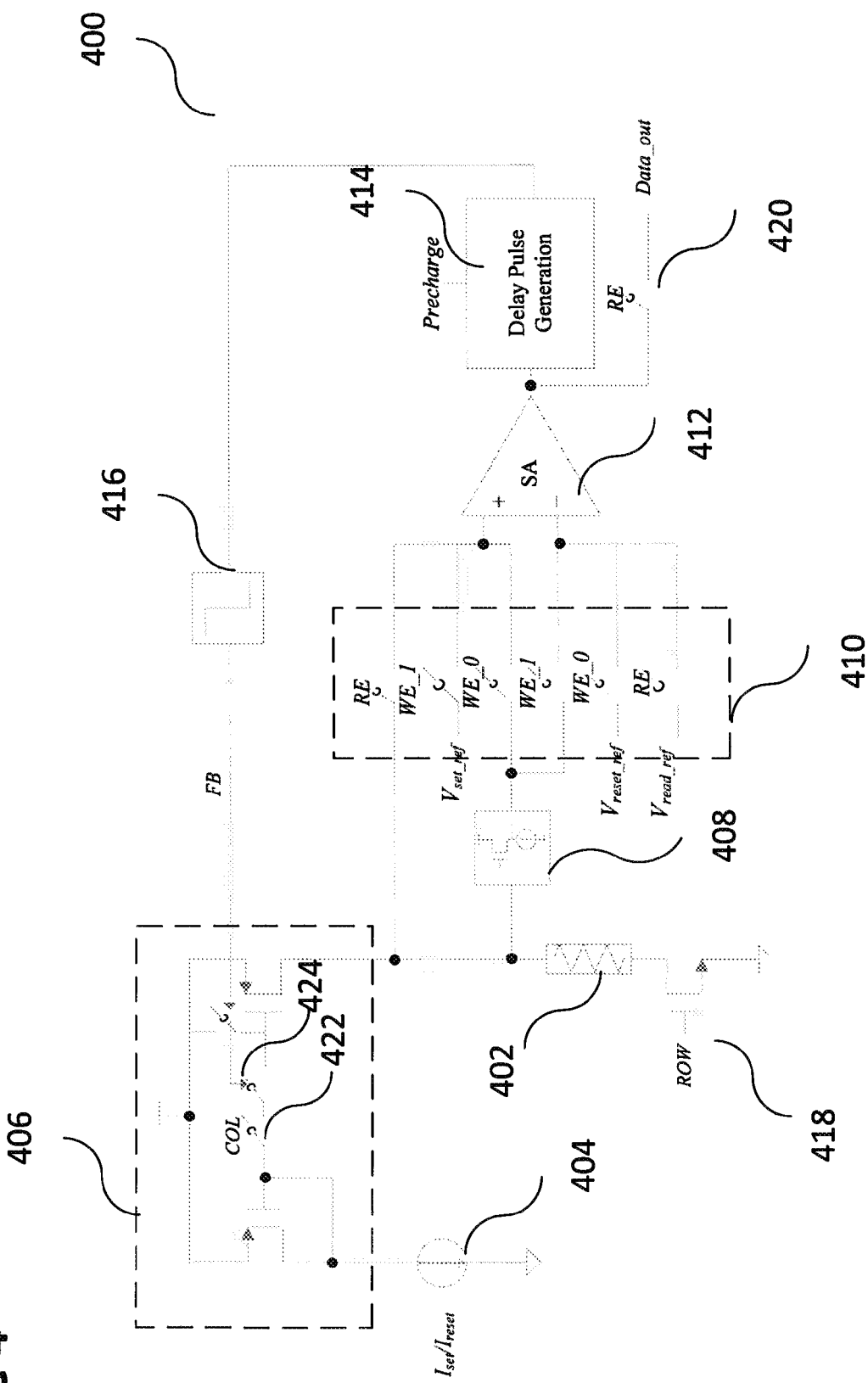
FIG. 4 is a diagram depicting the self-controlled auto turn off writing circuit for resistive non-volatile memory for unipolar write according to various embodiments.

FIG. 4 shows a diagram 400 depicting a self-controlled auto turn-off writing circuit (for example for resistive non-volatile memory; for example for unipolar write) according to various embodiments. A sensing circuit 412 may also be provided, like is shown in FIG. 4, and in more detail in FIG. 10, like will be described below. A current mirror 406 may be provided. The current mirror 406 mirrors the set or reset current and steers the mirrored current to the resistive non-volatile memory cell 402 depending on the input data. The auto turn-off writing circuit adopts current writing for the memory cell 402. Appropriate set and reset current may be mirrored to the memory cell (for example using the current mirror 406) depending on whether the data is 1 or 0 to set and reset the resistive NVM cell 402. The source follower 408 (which may include a voltage shifter (for example to shift down) and a source follower, and which may include a passive component (for example a diode) and an active component (for example the source follower)) may shift the voltage domain of the bitline voltage. Bitline voltage may be defined as the voltage of the common net which a column of the NVM cells are connected. The reference voltages may threshold the down-shifted bitline voltages. A switch 422 for addressing the column of the memory cell 402 and a switch 418 for addressing the row of the memory cell 402 may be provided.

A disconnection switch 424 may be provided to disable the current mirror based on an output of the level shifter 416. A current source 404 may provide a set current or a reset current. A switch 420 may be provided to provide a read out signal of the memory cell 402. It will be understood that switches (for example the switched 410 configured to provide the bitline voltage and the corresponding reference voltage to the SA 412) in FIG. 4 labelled RE (read enable) may be closed during reading out the memory cell 402, WE_1 (write enable 1) may be closed during writing a logical "1" into the memory cell 402, and WE_0 (write enable 0) may be closed during writing a logical "0" into the memory cell 402. A sense amplifier (SA) 412 may output an amplified difference (or comparison signal) to a delay pulse generator 414. As the SA 412 and the write circuit may work at different power domains, a level shifter 416 may shift (for example shift up) the signal output by the delay pulse generator 414.

According to various embodiments, auto-shutdown of the driving transistor by feedback may be provided to prevent over-time writing (for example for the cells require short pulse writing pulse width) and over-current (for example for high resistance to low resistance) and over-temperature.

According to various embodiments, resistance distribution may be reduced since R=V/I, V and I are fixed, so that R distribution may be minimized.

Various embodiments may provide precise control of the set and reset states of NVM, and improved writing accuracy. Various embodiments may save IC area by reusing the sense amplifier in the feedback loop during writing operation. Various embodiments may save power by putting write circuit and sense amplifier (SA) in different voltage supply domain using voltage and level shifters.

Figure 5:
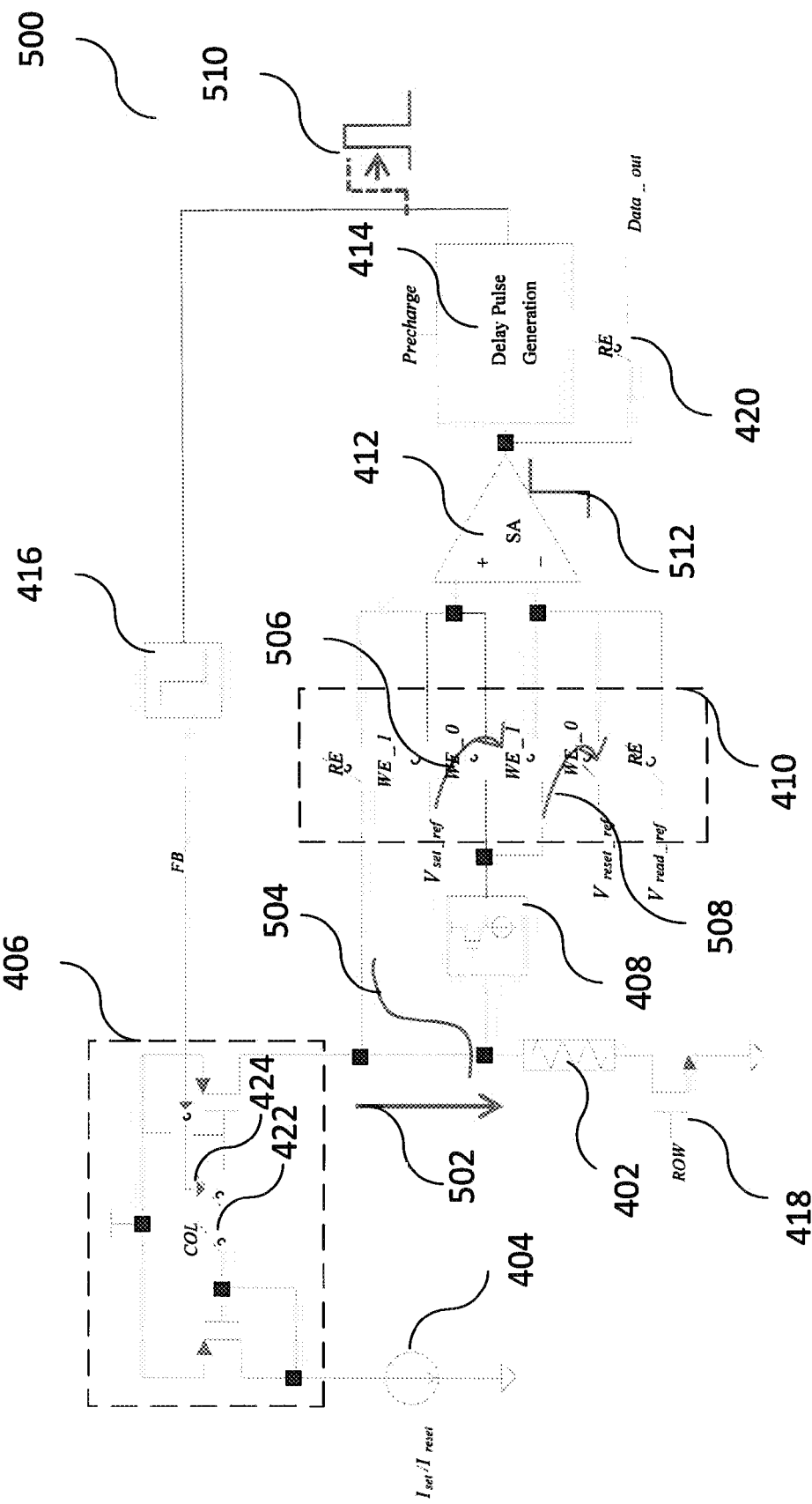
FIG. 5 is a diagram illustrating the operating principles of the auto turn off writing circuit during reset (writing 0) for resistive non-volatile memory according to various embodiments.

FIG. 5 shows a diagram 300 illustrating the operating principles of the auto turn-off writing circuit during reset (writing 0) for resistive non-volatile memory according to various embodiments. The components of the auto turn-off writing circuit shown in FIG. 5 may be the same or similar to the components shown in FIG. 4, and thus the same reference signs may be used and duplicate description may be omitted.

During reset (WE_0=1, wherein for example when the corresponding switches of the plurality of switches 410 are closed like indicated by arrows 506 and 508), the reset current is mirrored to the NVM 402 to change its state from low resistance (for example 1-50 k (for example in Ohm)) to high resistance (for example 100 k-10M (for example in Ohm)). The increase of resistance value causes the bitline voltage to increase, like indicated by arrows 502 and curve 504. This bitline voltage is then down-shifted by the source follower 408 to the input of the sense amplifier (SA) 412. The voltage is down-shifted by the transistor 904 (like shown in FIG. 9) in the source follower 408 to generate an output voltage that is lower than the input voltage by approximately a threshold voltage of the transistor 904. The SA 412 senses the voltage and compares with the reset reference voltage to determine whether the write process is successfully completed.

The SA 412 may be triggered in the low-to-high direction (like indicated by curse 512) by the (increased) bitline voltage with respect to the reference voltages during reset operation (for example the set and reset reference voltage respectively during set and reset operation). This may be because the bitline voltage increases due to the increase of resistance during reset. When the bitline voltage rises above the reference reset voltage, the SA 412 may be triggered and output becomes high.

A delay pulse 510 may be used to make sure the cells are fully reset. The pulse generation may be bypassed during read. The level shifters 408, 416 may transfer the signals between different voltage domain to reduce power consumption. Column Address Sel (COL) may be in series with the feedback control signal (disconnection switch and pull up switch).

The source follower (SF) 408 may down-shift the bitline voltage $V_{BL}$ to $V_{BL}-V_{gs}(=V_o)$.

The following equations shows the voltage and current relationship of the source follower: $I_{ds}=0.5u_nC_{ox}W/L*(V_{BL}-V_o-V_{th})^2$, $V_o=V_{BL}-\sqrt{(2I_{ds}/(u_nC_{ox}W/L))}-V_{th}$. $I_{ds}$ is the drain to source current of the transistor 904; W and L are the channel width and length of the transistor 904; $V_{th}$ is the threshold voltage of the transistor 904 and $V_o$ is the output voltage. The second equation is derived from the first and it shows the relationship of the output voltage and the various parameters of the transistor 904.

$V_{BL}-V_{gs}$ may be compared against reset reference $V_{reset\_ref}$. If $V_o>V_{reset\_ref}$, then the output of SA 412 SA_out=1, else if $V_o<V_{reset\_ref}$, SA_out=0.

Figure 6:
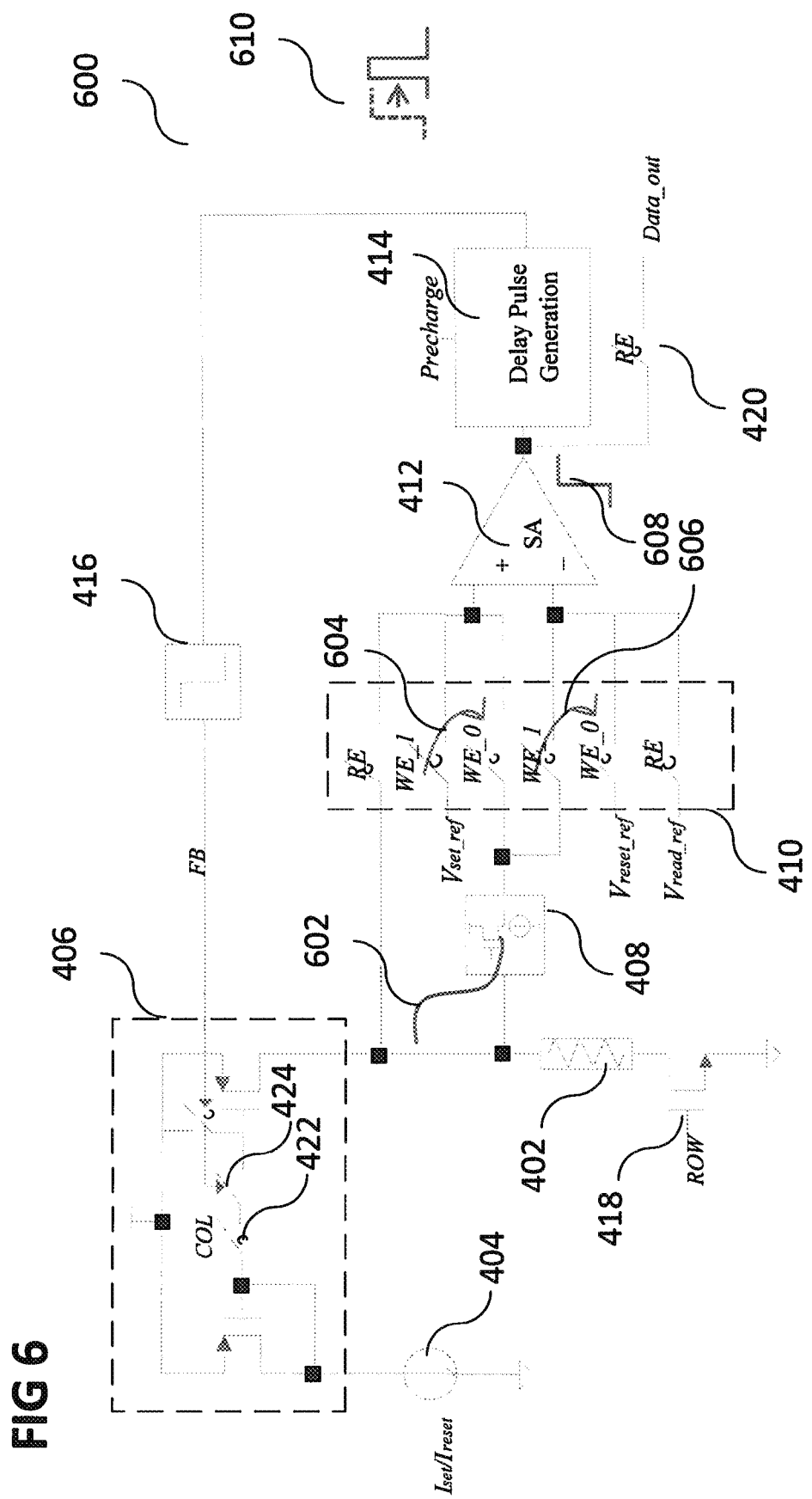
FIG. 6 is a diagram illustrating the operating principles of the auto turn off writing circuit during set (writing 1) for resistive non-volatile memory according to various embodiments.

FIG. 6 is a diagram 600 illustrating the operating principles of the auto turn-off writing circuit during set (writing 1) for resistive non-volatile memory 402. The components of the auto turn-off writing circuit shown in FIG. 6 may be the same or similar to the components shown in FIG. 4, and thus the same reference signs may be used and duplicate description may be omitted.

During set (WE_1=1, wherein for example when the corresponding switches of the plurality of switches 410 are closed like indicated by arrows 604 and 606), the set current may be mirrored to the NVM 402 to change its state from high to low resistance. The decrease of resistance value may cause the voltage at the bitline to decrease, like indicated by curve 602. This bitline voltage may be down-shifted by the source follower 408 to the input of SA 412. The SA 412 may sense the voltage and may compare it with the set reference voltage to determine whether the write process is successfully completed.

The SA 412 may be triggered in the high to low direction by the reduced bitline voltage w.r.t. reference voltages during set operation (which may be opposite polarity compared to reset). In other words, the SA 412 may be triggered in the opposite direction by the bitline voltage with respect to the set and reset reference voltage respectively during set and reset operation. This may be because the bitline voltage drops due to the decrease of resistance during set. When the bitline voltage drops below the reference set voltage, the SA may be triggered and output may become high, like indicated by curve 608.

The voltage shifter 408 and the level shifter 416 may transfer the signals between different power domains. The write circuit may require higher voltage supply to set and reset the resistive NVM effectively. Therefore, the write circuit may have high voltage supply (HVDD). However, the SA 412 and the delay generator 414 may operate with lower supply voltage (LVDD) in order to reduce power consumption as dynamic power is proportional to the square of VDD.

The voltage shifter 408 may be a diode or source follower (SF) to reduce the sensed bitline voltage from high voltage domain to low voltage domain. Level shifter 416 may be used to increase the feedback signal from low voltage domain to high voltage domain, specifically for digital signal.

The Column Address Sel (COL) signal may select the column of the memory array. COL may be in series with the feedback control signal such that during auto turn-off, the current mirror 406 is broken and disabled by the disconnection switch 424 and its gate voltage is pulled to VDD through the pull-up switch.

A delay pulse 610 may be used to make sure the cells are fully set. The level shifters 408, 416 may transfer the signals between different voltage domain to reduce power consumption.

The bitline voltage may be downshifted to SA 412 input $V_{BL}-V_{gs}$. It may be compare against set reference $V_{set\_ref}$. When $V_{BL}-V_{gs}>V_{set\_ref}$, SA=0. When $V_{BL}-V_{gs}<V_{set\_ref}$, SA=1.

Figure 7:
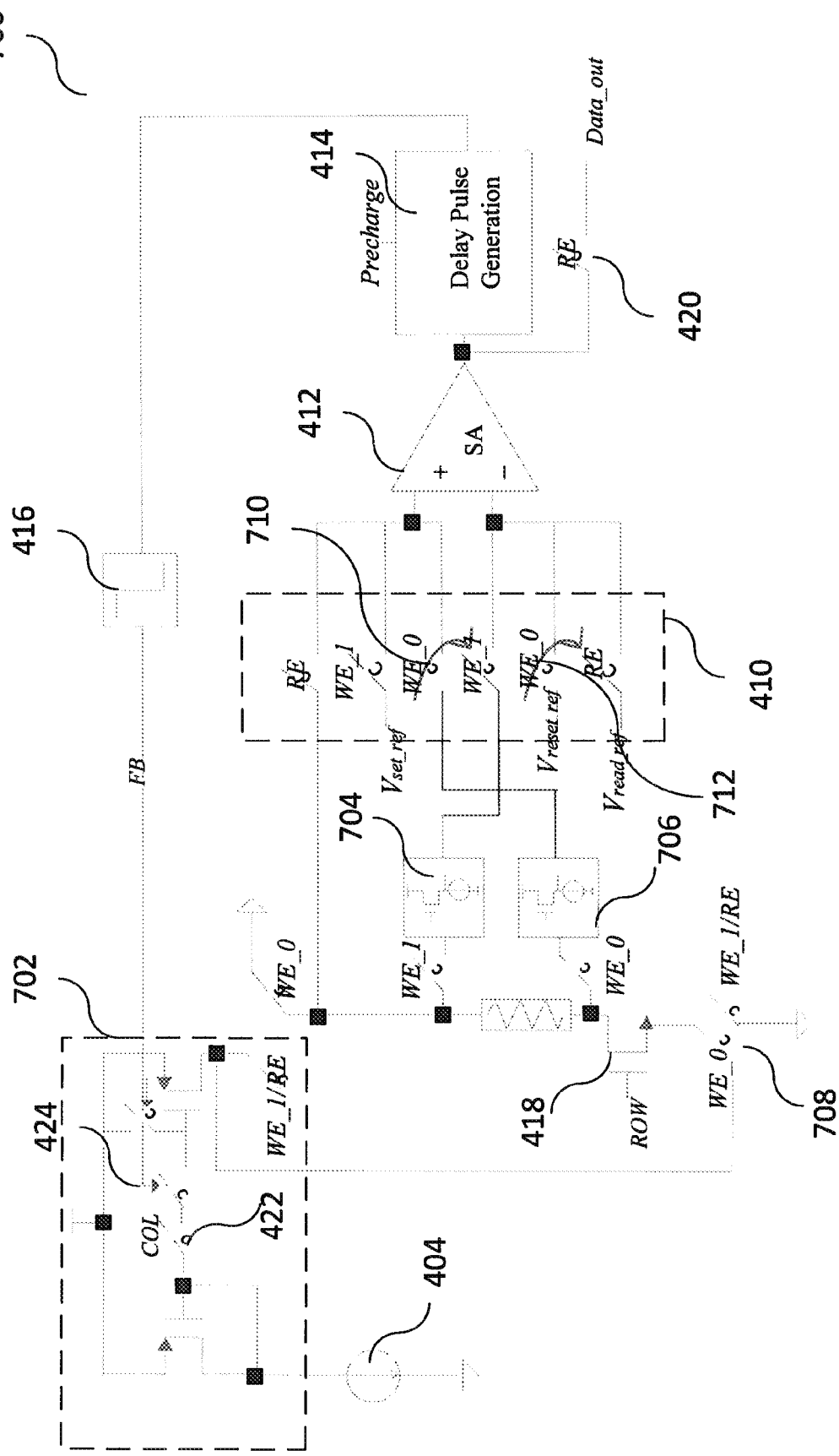
FIG. 7 is a diagram depicting the self-controlled auto turn off writing circuit for resistive non-volatile memory for bipolar write according to various embodiments.

FIG. 7 shows a diagram 700 showing the self-controlled auto turn-off writing circuit for resistive non-volatile memory for bipolar write. Some components of the auto turn-off writing circuit shown in FIG. 7 may be the same or similar to components shown in FIG. 4, and thus the same reference sips may be used and duplicate description may be omitted. A current mirror 702, a first source follower 704, a second source follower 706, and a ground switch arrangement 708 may be provided.

For bipolar writing, the set and reset current flows in opposite direction through the NVM cell 402. For set, the operating principle is same as the unipolar set operation. For reset (WE_0=1, wherein for example when the corresponding switches of the plurality of switches 410 are closed like indicated by arrows 710 and 712), the reset current is mirrored to the NVM cell from the bottom of the cell to change its state from low resistance to high resistance. An additional SF 706 is needed where the input of the SF 706 is from the source line instead of the bitline. Source line may be a common net where the bottom terminals of a column of NVM cells are connected. This source line voltage is down-shifted by the source follower 706 to the input of SA 412. The SA senses the voltage and compares with the reset reference voltage to determine whether the write process is successfully completed.

Figure 8:
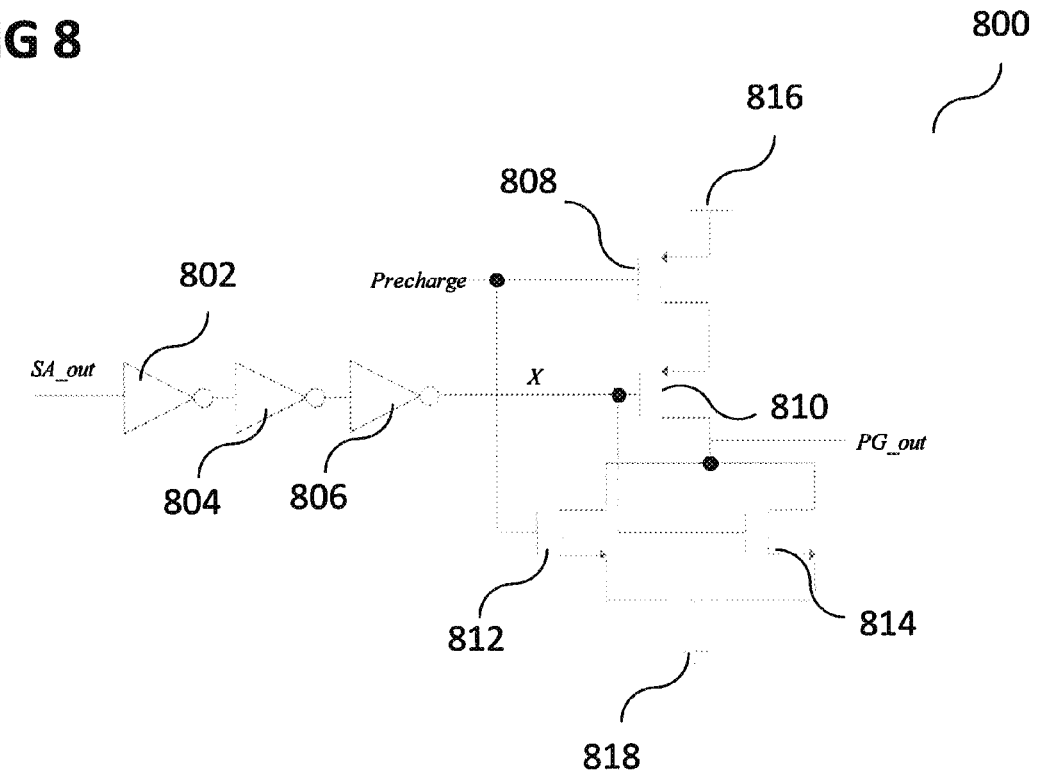
FIG. 8 is a diagram illustrating the delay pulse generator to generate the feedback pulse to shut off the driving circuit according to various embodiments.

FIG. 8 shows a diagram 800 illustrating the delay pulse generator to generate the feedback pulse to shut down the driving circuit. The delay pulse generator may include a plurality of inverters 802, 804, 806, and a plurality of transistors 808, 810, 812, 814, 816, 818. The delay pulse generator may control "on" and "off" of feedback loop during write and read respectively.

The delay of each inverter is approximately equal to $0.69R_{on}C_{par}$, where $R_{on}$ is the on-resistance of the transistors in the inverter and $C_{par}$ is the total parasitic capacitance including the drain-to-gate capacitance and drain-to-bulk capacitance of the transistors.

When SA_out=0, X=1 (wherein SA_out may be the input to the first inverter 802, and the output of the last inverter 806). When SA_out=1, X=0.

An inverter is needed after PG_out (not shown) as the feedback signal is connected to PMOS (P-type metal-oxide-semiconductor) gate (active low).

A delay pulse generated from the delay pulse generator may be used to ensure that the cells are fully set or reset by providing a pulse width margin. This delay pulse generator may control the turn-off period of the writing circuit by feeding back the signal to turn off the current mirror.

During read, the delay pulse generator may be disabled by a precharge signal. The output of the delay pulse generator may be pulled high, disabling the writing circuit. Output from the sense amplifier is directly sent to the memory controller.

If Precharge=1->PG_out=0; Precharge disables the feedback loop.

When Precharge=0->X=1 PG_out=0; X=0 PG_out=1; Precharge enables the feedback loop.

Figure 9:
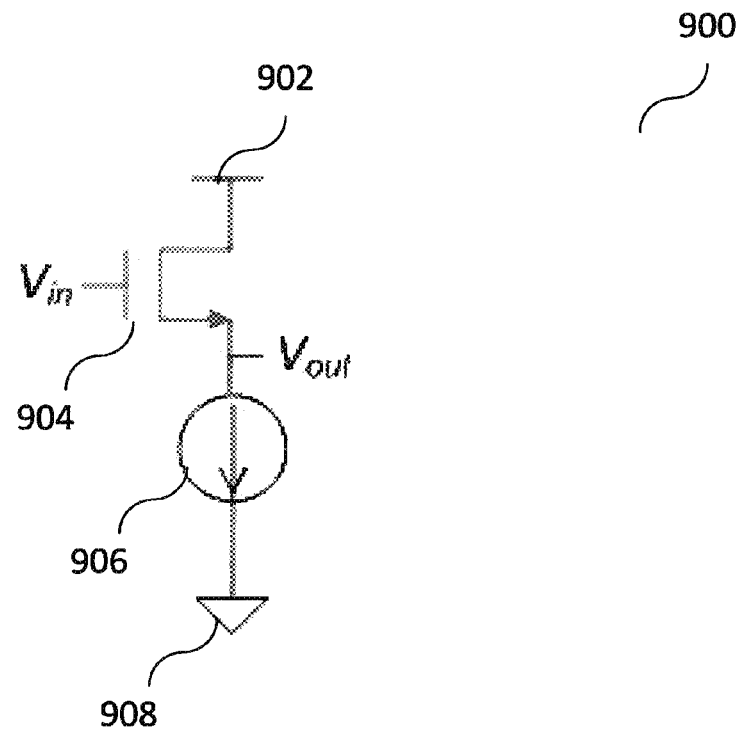
FIG. 9 shows a voltage shifter according to various embodiments.

FIG. 9 shows a voltage shifter 900 according to various embodiments. The voltage shifter is a simple source follower. 902 and 908 is the voltage supply and ground respectively. 906 is the current sink for setting the biasing voltages of the source follower. The source follower senses the signal at the gate of 904 or $V_{in}$ and drives the source of 904 or $V_o$, allowing $V_o$ to follow $V_{in}$.

Figure 10:
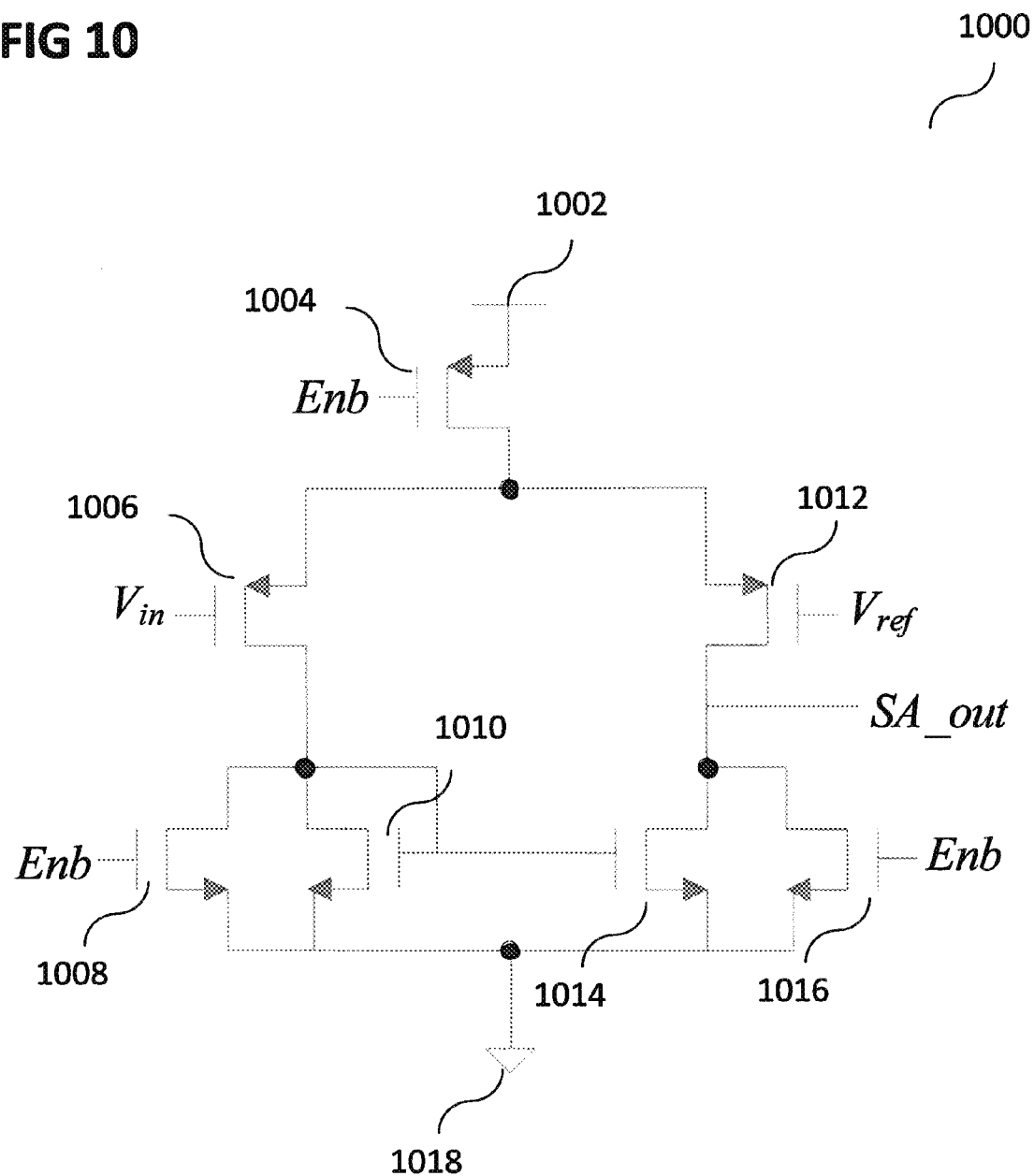
FIG. 10 is a diagram illustrating the sense amplifier to compare the voltage between the down-shifted input and the reference voltages according to various embodiments.

FIG. 10 shows a diagram 1000 illustrating the sense amplifier (in other words: sensing circuit) to compare the voltage between the down-shifted input and the reference voltages. Transistors 1006 and 1012 may be the input PMOS differential transistors. Transistors 1010 and 1014 act as an active current mirror load. The sense amplifier may be conditioned by the sense amplifier enable signal, Enb (active low), through three control transistors, 1004, 1008 and 1016. When Enb is high, the sense amplifier may be disabled, and the output voltage, SA_out may be pulled to ground. When Enb is low, the sense amplifier may be enabled, and the amplifier may evaluate based on the input voltage, $V_{in}$ and the reference voltage, $V_{ref}$.

During read operation, the bitline voltage is compared with the read reference voltage by the SA. The delay pulse generator is bypassed and the data is output.

Conventional latch based sense amplifier with internal positive feedback is not suitable in this design as the bitline voltage needs to be monitored continuously. The structure of the sense amplifier adopted is similar to a differential amplifier with PMOS input differential pair.

P differential pair, where the input transistors are formed by a pair of PMOS transistors, can operate with subthreshold input voltages (0.1V to 0.3V). Therefore, it is suited with resistive NVM specification, for example PCRAM. Besides, P differential pair also has lower noise than N differential pair.

Figure 11:
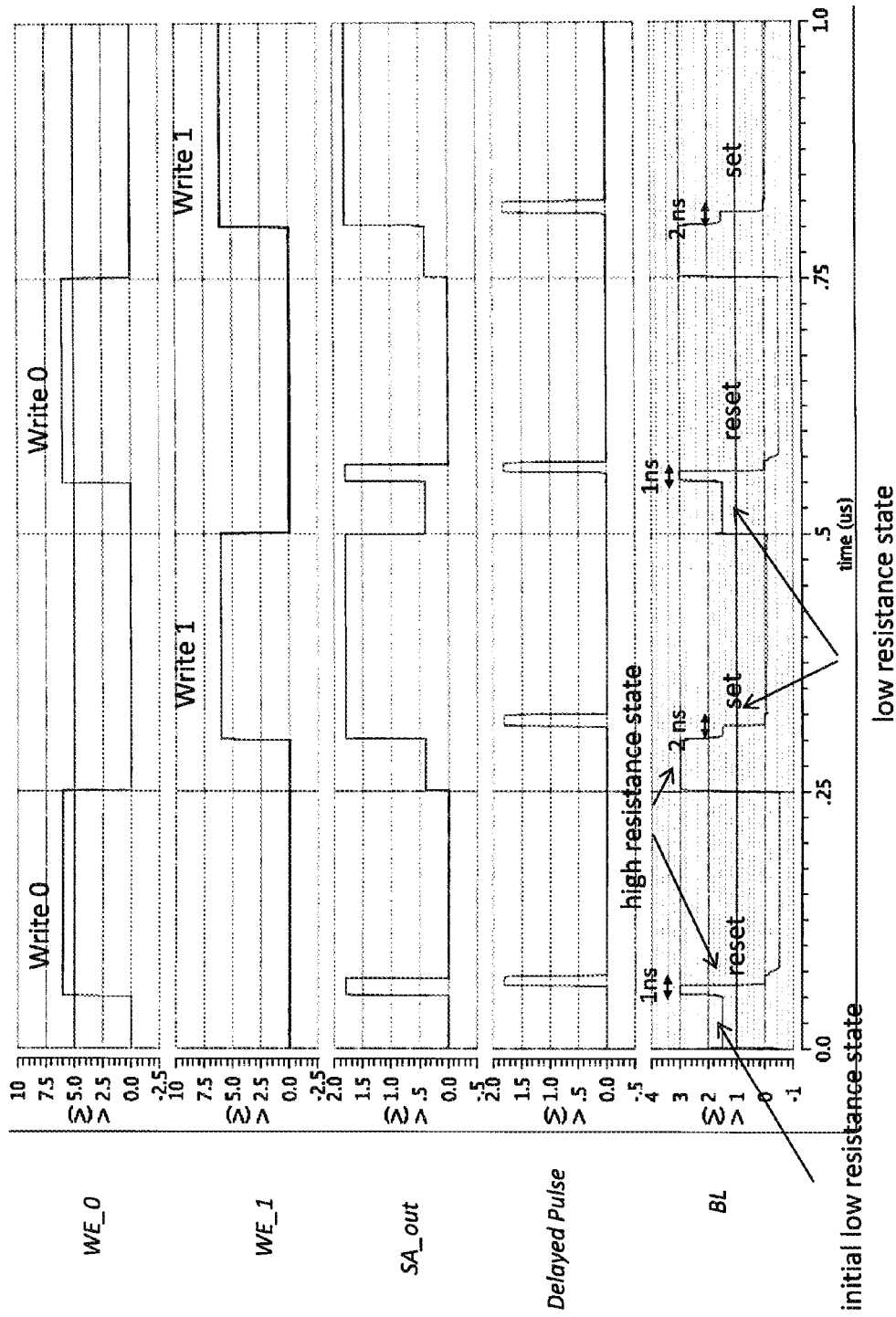
FIG. 11 show a diagram showing (simulation) waveforms, for example of the controlling signals and the bitline voltage of the resistive non-volatile memory in the present invention according to various embodiments.

FIG. 11 shows a diagram 1100 showing waveforms of the controlling signals and the bitline voltage of the resistive non-volatile memory according to various embodiments. A series of set (WE_1) and reset (WE_0) are written into the memory cell. Assuming the initial state of resistance NVM is of low resistance; As WE_0 becomes 1, the bitline (BL) voltage increases as resistance increases during reset. When downshifted bitline voltage increases beyond the reset reference voltage, the SA output (SA_out) becomes high, and the driving transistor will be switched off by the delayed pulse afters 1 ns. During set operation, WE_1 is 1, the bitline voltage decreases as resistance decreases during set. When downshifted bitline voltage reduces below the set reference voltage, the SA output becomes high, and the driving transistor will be switched off by the delayed pulse after 2 ns.

The power consumption for the auto turn-off circuit according to various embodiments may be 6.5 uW, which may be less than 1% of the total power consumption.

Figure 12:
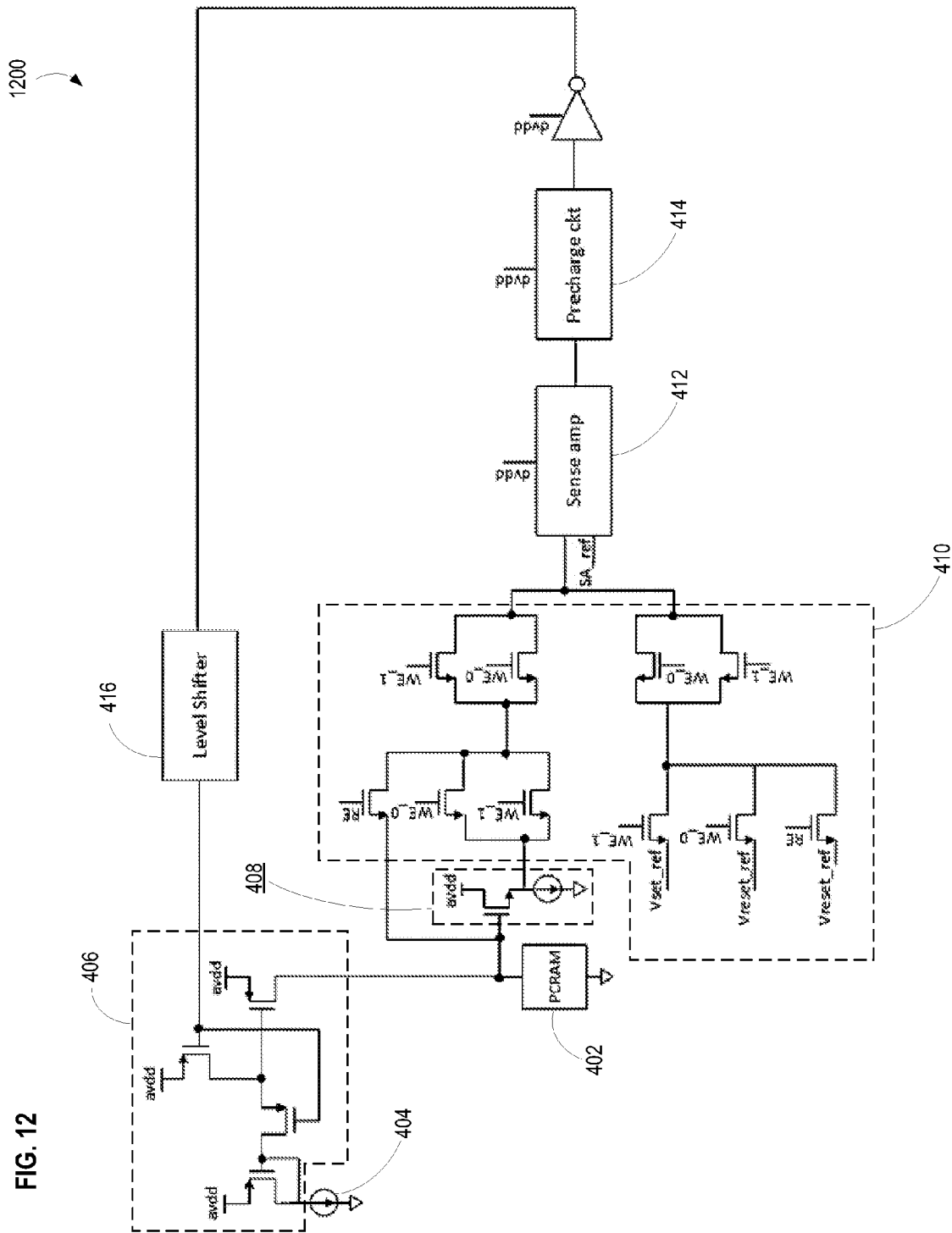
FIG. 12 shows an illustration of a testbench according to various embodiments.

FIG. 12 shows an illustration 1200 of a testbench according to various embodiments.

According to various embodiments, auto-shutdown of the 'set' and 'reset' pulse once the 'set' and 'reset' operation finish may be provided. Endurance of resistive NVM cells may be increased. The reliability of set and reset the NVM cell to low resistance and high resistance state respectively may be increased. Resistance distribution may be reduced. Lower power consumption (high clock frequency is not needed to generate the writing pulse) may be provided. Only little increase in IC area due to reuse-technique may be provided. Pre-detection of resistive NVM states may be provided, and there may be no requirement of read before write.

According to various embodiments, self-control of the 'set' and 'reset' pulse may be provided instead of being generated (for example for a fixed length of time) from a memory controller. This may provide an inherent over-current protective circuit. Read SA and control logic path may be reused.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A write control circuit configured to control writing to a memory cell by applying a writing current to the memory cell, the write control circuit comprising:
    a current application circuit configured to apply the writing current to the memory cell;
    a determination circuit configured to determine whether writing to the memory cell is finished;
    a stop writing circuit configured to cut off the writing current from the memory cell if it is determined that writing to the memory cell is finished; and
    wherein the current application circuit is configured to apply the writing current to the memory cell for bipolar writing; and
    wherein the determination circuit is configured to determine whether writing to the memory cell is finished based on a source line voltage of the memory cell.

2. The write control circuit of claim 1,
    wherein the determination circuit is configured to determine whether writing to the memory cell is finished based on a bitline voltage of the memory cell.

3. The write control circuit of claim 2,
    wherein the determination circuit is configured to determine whether writing to the memory cell is finished based on comparing the bitline voltage of the memory cell with a reference voltage.

4. The write control circuit of claim 1, further comprising:
    a downshifter configured to downshift the bitline voltage.

5. The write control circuit of claim 4, further comprising:
    a sense amplifier configured to compare the downshifted bitline voltage with a reference voltage;
    wherein the determination circuit is configured to determine whether writing to the memory cell is finished based on the comparison of the sense amplifier.

6. The write control circuit of claim 1, further comprising:
    a delay pulse generator configured to generate a delayed pulse;
    wherein the stop writing circuit is configured to cut off the writing current from the memory cell based on the delayed pulse.

7. The write control circuit of claim 6, further comprising:
    an upshifter configured to boost up the delayed pulse;
    wherein the stop writing circuit is configured to cut off the writing current from the memory cell based on the boosted delayed pulse.

8. The write control circuit of claim 1,
    wherein the current application circuit comprises a current mirror.

9. The write control circuit of claim 8,
    wherein the stop writing circuit is configured to cut off the writing current from the memory cell by disabling the current mirror.

10. The write control circuit of claim 1, further comprising the memory cell.

11. The write control circuit of claim 10,
    wherein the memory cell comprises at least one of a resistive random access memory or a phase change random access memory.

12. A write control method for controlling writing to a memory cell by applying a writing current to the memory cell, the write control method comprising:
    applying the writing current to the memory cell;
    determining whether writing to the memory cell is finished;
    cutting off the writing current from the memory cell if it is determined that writing to the memory cell is finished; and
    applying the writing current to the memory cell for bipolar writing; and
    determining whether writing to the memory cell is finished based on a source line voltage of the memory cell.

13. The write control method of claim 12, further comprising:
    determining whether writing to the memory cell is finished based on a bitline voltage of the memory cell.

14. The write control method of claim 13, further comprising:
    determining whether writing to the memory cell is finished based on comparing the bitline voltage of the memory cell with a reference voltage.

15. The write control method of claim 12, further comprising:
    downshifting the bitline voltage.

16. The write control method of claim 15, further comprising:
    comparing the downshifted bitline voltage with a reference voltage; and
    determining whether writing to the memory cell is finished based on the comparing.

17. The write control method of claim 12, further comprising:
    generating a delayed pulse; and
    cutting off the writing current from the memory cell based on the delayed pulse.

18. The write control method of claim 17, further comprising:
    boosting up the delayed pulse; and
    cutting off the writing current from the memory cell based on the boosted delayed pulse.

* * * * *